United States Patent [19]

Balasubramanyam et al.

[11] 4,405,710

[45] Sep. 20, 1983

[54] ION BEAM EXPOSURE OF (G-GE$_x$-SE$_{1-x}$) INORGANIC RESISTS

[75] Inventors: Karanam Balasubramanyam; Arthur L. Ruoff, both of Ithaca, N.Y.

[73] Assignee: Cornell Research Foundation, Inc., Ithaca, N.Y.

[21] Appl. No.: 276,115

[22] Filed: Jun. 22, 1981

[51] Int. Cl.³ .............................................. G03C 5/00
[52] U.S. Cl. .................... 430/311; 430/312; 430/396; 430/935; 430/296; 430/325; 430/326; 427/91; 427/99; 427/124
[58] Field of Search ............... 430/935, 323, 325, 317, 430/326, 324, 396, 311, 312, 296, 128; 427/43.1, 83, 91, 99, 124, 250, 255

[56] References Cited

U.S. PATENT DOCUMENTS 4,127,414 11/1978 Yoshikawa et al. ............... 430/270
4,269,935 5/1981 Masters et al. ..................... 430/272
4,276,368 6/1981 Heller ................................. 430/270

FOREIGN PATENT DOCUMENTS 56-125845 10/1981 Japan .

Primary Examiner—Mary F. Downey
Attorney, Agent, or Firm—Jones, Tullar & Cooper

[57] ABSTRACT

This invention relates to thin (g-Ge$_x$-Se$_{1-x}$) positive ionresists and thin (g-Ge$_x$-Se$_{1-x}$) with absorbed or chemically bonded silver as a negative ionresist, which when exposed to H$^+$ ion beams and subsequently developed, for example by alkaline solutions, have a useful differential dissolution rate, when comparing exposed and unexposed areas, with excellent resolution. The ionresist materials and processes of the invention are useful, for example, in forming solid-state electronic articles.

8 Claims, 5 Drawing Figures

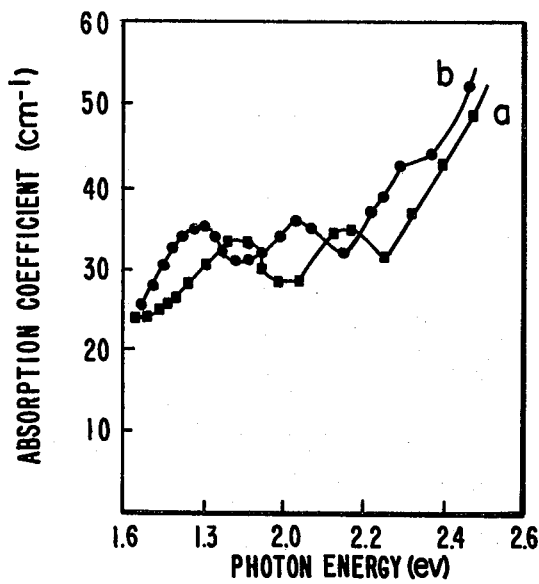
FIG.I
OPTICAL ABSORPTION SPECTRA OF $Geo_{25}Seo_{75}$ THIN FILM (a.) UNEXPOSED AND (b) EXPOSED TO 40 KeV ($H^+$) IONS WITH A DOSE OF $10^{-4}$ C/cm$^2$
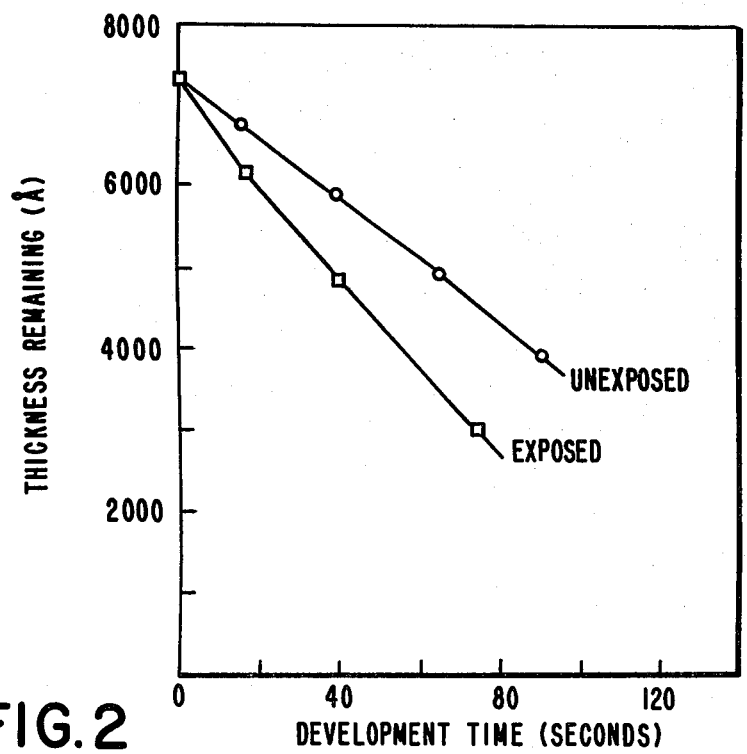
FIG.2
ETCHING BEHAVIOR OF ION BEAM ($H^+$) EXPOSED $Geo_{25}Seo_{75}$ THIN FILM TO A DOSE OF 1 X $10^{-3}$ C/cm$^2$ AT 150 KeV AND DEVELOPED IN 1-3 SOLUTION OF $(CH_3)_2$ NH AND DI WATER CONTRAST CURVES FOR A POSITIVE IMAGING PROCESS $Ge_{025}Se_{075}$ EXPOSED TO DIFFERENT DOSES OF IONS ($H^+$) AT 40 AND 150 KeV, INITIAL FILM THICKNESS 7000 Å

POSITIVE IMAGING PROCESS WITH A CONFORMAL GOLD MASK

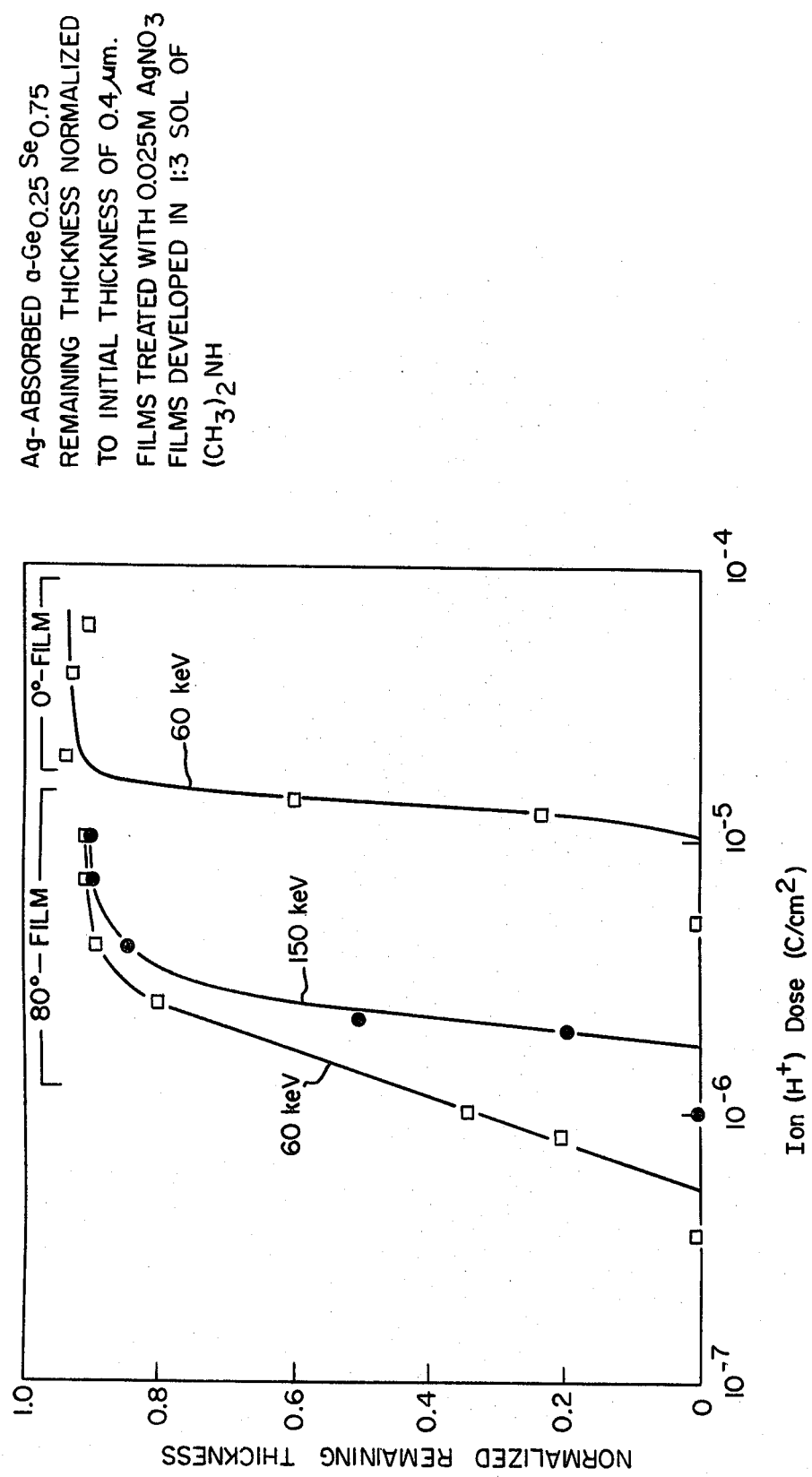

ION BEAM EXPOSURE OF (G-GE$_x$-SE$_{1-x}$) INORGANIC RESISTS

BACKGROUND OF THE INVENTION

Recently thin films of amorphous chalcogenide glasses have been investigated as inorganic resists for microlithography. These materials offer an attractive potential alternative to polymer resists because of a number of advantages, such as the possibility of preparing physically uniform films of thickness as small as 200 Å with insignificant numbers of pin-holes, mechanical, optical and thermal stability, compatibility with dry processing, and the possibility of obtaining both positive and negative resist action in the same material under different processing conditions. In addition, these films are resistant to strong acids such as HCl, H$_2$SO$_4$, H$_3$PO$_4$, and HF. Patterns can directly be etched on Si, Si$_3$N$_4$, and SiO$_2$. However, the sensitivity of the positive resist is rather poor. Moreover, the difference in solubility between exposed and unexposed portions of the as-deposited films is not much, resulting in poor contrast. Since an amorphous film is in a metastable state, its structure can be changed by suitable radiation. Some of the physical and chemical properties are affected by the structural changes providing, therefore, the possibility of enhancing the radiation induced effects pertinent to lithographic behavior of these films.

Pattern generation in inorganic resists has been demonstrated by optical [Nagai et al., *Appl. Phys. Lett.*, 28 145 (1976); Yoshikawa et al., *Appl. Phys. Lett.*, 29 677 (1976); Tai et al., 155th Electrochem. Soc. Spring Mtg. May 1979; Tai et al., *J. Vac. Sci. Technol.*, 16 1977 (1979); Balasubramanyam et al., *Bull. Am. Phys. Soc.*, 25 3 (1980); Chang et al., *Appl. Phys. Lett.*, 33 892 (1978); Chang et al., *Opt. Commun.*, 24 220 (1978)], electron beam [Yoshikawa, *Appl. Phys. Lett.*, 31 161 (1977)] and X-ray [Kolwicz et al., *J. Electrochem. Soc., Solid St. Sci. and Technol.*, 127, 135 (1980)] lithographic techniques.

BRIEF DESCRIPTION OF THE DRAWINGS

FIG. 1 graphically represents the optical absorption spectra of Ge$_{0.25}$Se$_{0.75}$ thin film, (a) unexposed, and (b) exposed to 40 keV (H$^+$) ions with a dose of $10^{-4}$ C/cm$^2$.

FIG. 2 graphically represents the etching behavior of ion beam (H$^+$) exposed Ge$_{0.25}$Se$_{0.75}$ thin film to a dose of $1\times10^{-5}$ C/cm$^2$ at 150 keV and developed in 1:3 solution of (CH$_3$)$_2$NH and deionized water.

FIG. 5 graphically represents the contrast curve for a negative resist of the invention.

DESCRIPTION OF THE INVENTION

Figure 3:
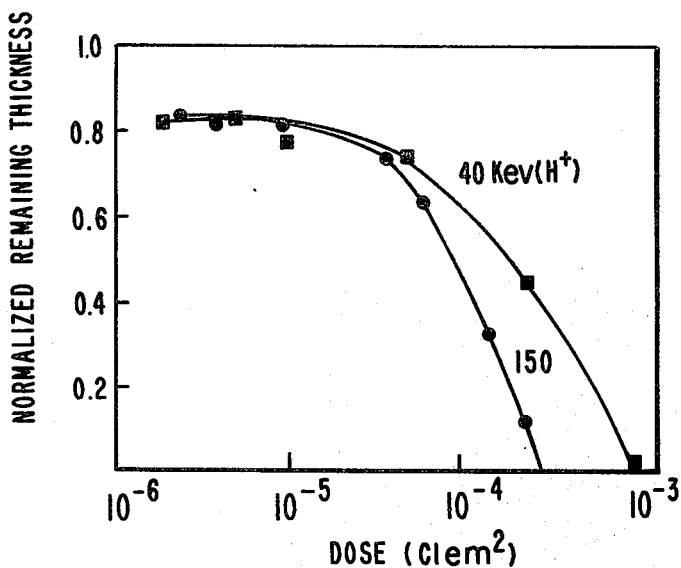
FIG. 3 graphically represents the contrast curves for a positive imaging process; Ge$_{0.25}$Se$_{0.75}$ exposed to different doses of ions (H$^+$) at 40 and 150 keV; initial film thickness 7000 Å.

This invention relates to thin (g-Ge$_x$Se$_{1-x}$) glassy, amorphous, film positive ion resists which when exposed to H$^+$ ion beams and subsequently developed, for example, by alkaline solutions, have a useful differential dissolution rate, with excellent resolution (for example, down to about 0.6 μm). Preliminary results lead us to anticipate a resolution of 0.1μ or better. The ion resist materials and processing of the invention are useful, for example, in forming solid-state electronic articles.

Generally, the process of the invention comprises forming on a solid substrate a thin (g-Ge$_x$Se$_{1-x}$) film, exposing a portion of said film with an H$^+$ ion beam at voltage adapted and with an ion dose sufficient to provide a substantial differential dissolution rate between the exposed and unexposed portions of the film when developed with a developer for said film, and developing said film by removing the exposed portion of the film to uncover the corresponding portion of the substrate, while the unexposed portion of the substrate, while the unexposed portion of said film remains adhered to the substrate.

The germanium-selenium films employed in the invention are amorphous, glassy (g-Ge$_x$Se$_{1-x}$) films wherein x is between about 0.1 and about 0.9 and preferably between about 0.2 and about 0.55. The formation of deposits of such films upon a substrate are known in the art. Generally, the thickness of the film coated upon the substrate is between about 50 Å and about 20,000 Å and preferably between about 500 Å and about 5000 Å.

The substrate employed is not critical so long as the (g-Ge$_x$Se$_{1-x}$) film is firmly adherent to the substrate so that upon exposure and suitable development, the unexposed areas remain adhered to the substrate. Where solid state electronic components are envisioned, typically the substrate will be glass, Si, SiO$_2$, and other typically employed substrates known in the art.

A preferred method for forming the (gGe$_x$Se$_{1-x}$) film on the substrate is vacuum vapor deposition (vacuum evaporation, or sputtering), well known techniques. It has been discovered that the angle of deposition affects the dissolution rate in the development step. Oblique angles are preferred, preferably at an angle between about 5° to about 85° with respect to the normal, most preferably between about 10° to about 80° with respect to the normal.

Films deposited at an angle of 40° with respect to normal (hereinafter called 40° films) have shown up to three times greater differential solubility in a comparison to films deposited at normal incidence (hereinafter called 0° films).

A masking layer in the form of a predetermined pattern is interposed between the ion beam source and said film, and can be virtually any ion beam retarding material, i.e. a material which is substantially opaque to the ion beam. While it does not need to be in contact with the film, for maximum resolution it is desired that the mask be a conformal mask, removably adherent to the film. Again the masking materials, e.g. heavy metals, usually gold, and methods of forming and employing masks are generally known (see for example Bohlen et al., *Proc. 8th Int. Conf. on Electron and Ion Beam Science and Technology*, 420 (1978); Rensch et al., *J. Vac. Sci. Technol.* 16, 1897 (1979)).

Typically, the H$^+$ ion beam employed in the process of the invention is an H$^+$ ion beam having a voltage between about 30 to about 300 keV, and preferably between about 40 to about 150 keV. Ions other than H$^+$ can be used. The unmasked portions of the film are exposed to an ion dose sufficient to allow complete removal of the exposed film portions upon development, while a predetermined thickness of the masked portion of the film remains adhered to the substrate. As set forth in the Example, sensitivity, i.e. the ion dose necessary to completely remove a 0.70 μm thick resist film of g-Ge$_{0.25}$Se$_{0.75}$ upon development with a $(CH_3)_2NH$ solution is $\sim 10^{-4} C/cm^2$. The sensitivity at a particular voltage of any particular film can readily be determined.

Once sufficiently exposed, there exists a significant differential solubility between the exposed and unexposed areas of the film. Usually this rate differential is at least about 18% and with oblique film deposition is preferably at least about 25% and most preferably in excess of 50%.

The exposed films are developed with a solvent for the $Ge_xSe_{1-x}$ film. Such solvents are known in the art. Generally, basic solvents are preferred, for example, alkaline solutions such as KoH, potassium hydroxide, or $(CH_3)_2NH$, dimethyl amine.

The resultant structure comprises the substrate having a predetermined portion thereof uncovered, with another predetermined portion thereof retaining an adherent $Ge_xSe_{1-x}$ continuous film.

If desired, especially where solid-state electronic articles are contemplated, steps such as doping of the uncovered substrate, deposition of conductive layers or etching of the substrate may follow.

There follows an Example which is to be considered illustrative rather than limited. All parts and percentages are by weight unless otherwise specified.

EXAMPLE

Bulk $Ge_xSe_{1-x}$ materials were prepared by melting the appropriate mixture of high purity elements (99.999%) in an evacuated quartz ampoule which is constantly rotated in order to intermix the components, and then quenching the ampoule in cold water. Consequently, films were formed on precleaned glass and Si substrates by vacuum evaporation or sputtering. The composition of the deposited films was, within experimental error, the same as that of the source material as determined by electron microphobe (JEOL Superprobe 733) analysis. Within the investigated range of composition, $g-Ge_{0.25}Se_{0.75}$ was found to have optimum wet selective etching characteristics, similar to optically exposed films. [Nagai et al., *Appl. Phys. Lett.*, 28, 145 (1976); Balasubramanyam, supra. (1980); Singh et al., *J. Appl. Phys.*, 51 176 (1980)]. Hence, this particular composition was used for the present investigation. A substrate holder arrangement was used to simultaneously deposit films at different angles of incidence of vapor ranging from 0° to 80° with respect to the normal. In the present example, results for films deposited at 40° are presented. Photo-induced optical changes are enhanced considerably in obliquely deposited GeSe films [Balasubramanyan et al., supra: Singh et al., supra]. The photochemical phenomenon appears to be related to the photo-induced optical changes.

The ion beam exposure was carried out at different accelerating voltages using a proton beam from an ion implanter (Accelerators, Inc. 300R). The final H+ beam aperture had a diameter of 1 cm and was 2 m away from the sample. Large areas of 9 mm$^2$ were exposed to facilitate optical absorption measurements. A Cary 14 spectrophotometer was used to record the ion beam induced absorption edge shift in these films. An identical uncoated substrate was used as a reference during optical absorption measurements. Microphotographs were taken using the Cambridge S150 SEM.

As shown in FIG. 1, the exposed $Ge_{0.25}Se_{0.75}$ thin film shows an increase in optical absorption after exposure to $10^{-4}C/cm^2$ of H+ (40 keV). The observed shift in the absorption edge toward longer wavelengths is consistent with that in films exposed to optical radiation [Nagai et al., supra; Singh et al., supra]. The ion beam exposure may be facilitating microstructural rearrangements within the short range of the GeSe network so that the atomic configuration of the system reaches a new metastable state [Agarwal et al., *Phys. Rev. B*10, 4351 (1975); Chopra, private comm.] Due to changes in the short range order, the chemical bonding may be affected, which results in increased chemical dissolution in ion-exposed films.

A $g-Ge_{0.25}Se_{0.75}$ thin film was exposed to a dose of $10^{-5}C/cm^2$ at 150 keV H+ through a metal mask containing 0.025 mm holes. The selective etching characteristics of the irradiated film, after development in an aqueous solution of 1:3 $(CH_3)_2NH$ is shown in FIG. 2. The exposed area etches 58% faster than the unexposed area. In the case of a 0° film, the exposed area etches only 18% faster than the unexposed area. Hence, such films behave like positive resists under ion beam irradiation.

FIG. 3 shows typical contrast curves of $g-Ge_{0.25}S_{0.75}$ films exposed to 40 and 150 keV H+ ion beams. As seen from these curves, sensitivity, i.e., the ion dose necessary to completely remove a 0.70 $\mu m$ thick resist film upon development, is $\sim 10^{-4} C/cm^2$. The sensitivity of this material as a positive ion resist ($\sim 5J/cm^2$ at 60 keV) is better than its sensitivity as a positive photoresist ($\sim 10J/cm^2$) [Yoshikawa (1976), supra; Balasubramanyam, supra] or electron beam ($\sim 20J/cm^2$ at 20 keV) positive resist. Furthermore, ion beam sensitivity increases monotonically for decreasing H+ ion energy down to $\sim 70$ keV, and then decreases for lower energies. The reason for this is the following: at the energies considered, the ion energy loss is dominated by losses due to interactions with the target electrons, and the stopping power curve exhibits a maximum at $\sim 70$ keV [Andersen et al., "Stopping and Ranges of Ions in Matter," Vol. 3, Pergamon, NY, 1977].

Figure 4:
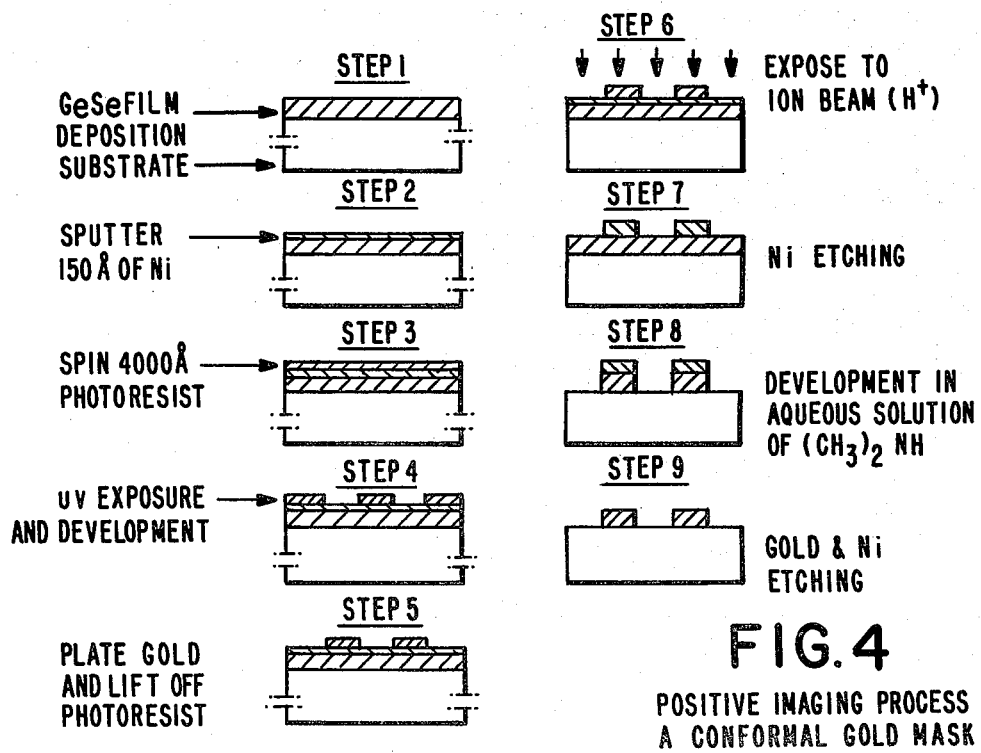
FIG. 4 is a schematic representation of a preferred mode positive imaging process with a conformal gold mask.

Next, a test pattern was produced in a $g-Ge_{0.25}Se_{0.75}$ film by means of H+ ion irradiation through a conformal gold mask. A standard photolithographic technique followed by electroplating was used for the fabrication of the mask. The fabrication steps are outlined in FIG. 4. Pre-cleaned Si wafers were coated with $\sim 7000$ Å of $Ge_{0.25}Se_{0.75}$ and then 150 Å of Ni was sputtered to later serve as a base for electroplated gold. Following this, 4000 Å of AZ 1350 J photoresist was spin-coated on the GeSe film. A Kasper 10:1 aligner was used to produce an interdigitated pattern in the photoresist with repeat distances 2 and 1.2 $\mu m$. Then 3000 Å of gold was electroplated on the unmasked areas of the Ni coated GeSe. The photoresist was removed with acetone leaving a conformal gold mask on the Ni coated GeSe film.

Micrographs of the gold mask were made. The masked GeSe films were then exposed with protons of dose $10^{-4}C/cm^2$ at an accelerating voltage of 60 keV and developed in 3:1 dimethylamine and DI water; excess selenium on the resist is removed by adding sodium borohydride. The reaction mechanisms are:

$4Ge_{0.25}Se_{0.75} + 8(CH_3)_2NH + 4H_2O \longrightarrow$

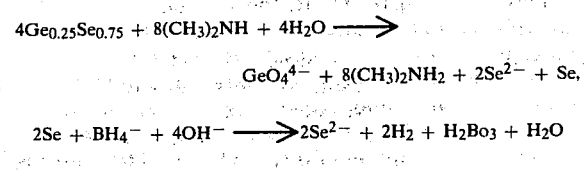

$GeO_4^{4-} + 8(CH_3)_2NH_2 + 2Se^{2-} + Se,$ $2Se + BH_4^- + 4OH^- \longrightarrow 2Se^{2-} + 2H_2 + H_2Bo_3 + H_2O$ 1 and 0.6 μm linewidth interdigitated electrode patterns for high pressure research [Ruoff et al., in "High Pressure Science & Technol.," Vol. 1, p. 779, Plenium, NY (1979); Nelson, Jr. et al., *Phys. Rev. Lett.*, 42 383 (1979)] were generated in GeSe inorganic resist as described above. Interdigitated electrode patterns were used to obtain extremely high pressures in a tiny region of diamond to study insulator to metal transitions in a wide variety of materials. For example, to get pressure above 1 Mbar requires a contact region of 1 μm. Electrical resistance measurements can be conveniently carried out by using interdigitated electrodes placed directly on the diamond anvil. The features of the mask are well produced in a 1 μm pattern. Sloping walls produced in the pattern are due to the rather low differential etching rate between the exposed and unexposed parts and this imposes an inherent limitation to mimimum linewidths that can be achieved. The 0.6 μm linewidth mask which was produced by optical lithography has lines with rough edges probably caused by diffraction effects. These rough edges, of course, are transmitted to the final pattern in the g-Ge$_{0.25}$Se$_{0.75}$ resist.

Exposure of amorphous chalcogenide thin films to radiation with energy greater than the band gap (2 eV for g-Ge$_{0.25}$Se$_{0.75}$ films) produces various types of structural changes such as radiation induced decomposition, densification, and doping effects. These effects are pronounced in obliquely deposited germanium-based chalcogenide thin films [Phillips, *J. Non-Cryst Solids*, 35 and 36 1085 (1980)]. It has been postulated that such films are often nonhomogeneous and nonisotropic and frequently have a columnar structure with a large density of surface states, voids and dangling bonds and an associated large surface area. In certain amorphous materials such as Ge, the angle of the columns is related to the angle of incidence of the vapor [Dirks et al., *Thin Solid Films*, 47, 219 (1977)], although this relation has not been established for g-Ge$_x$Se$_{1-x}$ thin films. Because of this defect structure, it is postulated that when these films are exposed to ion beams, there would be a large change in density and refractive index of the film (as is the case with UV exposure). This is probably the origin of the enhanced chemical dissolution rate after ion beam exposure in obliquely deposited g-Ge$_{0.25}$Se$_{0.75}$ films.

The g-Ge$_x$Se$_{1-x}$ film resist exhibits good thermal stability because of its high glass transition temperature T$_g$ (250° C. for g-Ge$_{0.25}$Se$_{0.75}$ and 400° C. for g-GeSe$_2$). This superior heat resistance enables one to employ the resist "lift-off" metalization technique at elevated temperatures (generated during evaporation of materials having high melting points) or the sputtering technique.

In another embodiment the g-Ge$_x$Se$_{1-x}$ films of the invention, after dipping in acqueous silver nitrate solution, can be employed as a negative ion resist. In this embodiment, the g-Ge$_x$Se$_{1-x}$ film is coated upon a substrate as above. Then, the surface of the g-Ge$_x$Se$_{1-x}$ film is contacted with a silver ion contributing media, for example, an aqueous silver nitrate solution, capable of forming silver selenide (Ag$_2$Se) on the surface of the g-Ge$_x$Se$_{1-x}$ fil,. The resultant silver selenide coated g-Ge$_x$Se$_{1-x}$ coated substrate is then masked with a suitable mask such as described above, but with the open area of the mask conforming to the portions of the g-Ge$_x$Se$_{1-x}$ film sought to be preferentially retained.

The masked Ag$_2$Se surface is then exposed to H+ ion beam irradiation at voltages as described above in a manner similar to that described above, but at a voltage adapted to and with an ion dose sufficient to cause substantially complete migration of the silver ions from the surface of the exposed Ag$_2$Se areas into the interior of the g-Ge$_x$Se$_{1-x}$ film, thereby producing substantial differential dissolution rate between the masked and unmasked portions of the g-Ge$_x$Se$_{1-x}$ film. The resultant exposed silver ion containing Ge$_x$Se$_{1-x}$ film portion has substantially less solubility than the untreated g-Ge$_x$Se$_{1-x}$ film where contacted with g-Ge$_x$Se$_{1-x}$ film solvents. Prior to development of the g-Ge$_x$Se$_{1-x}$ ion resist, the unexposed Ag$_2$Se layer is removed by an Ag$_x$Se layer stripping solvent, for example aqua regia. The resultant g-Ge$_x$Se$_{1-x}$ film is then developed with a solvent as above, but by removing the unexposed portion of the g-Ge$_x$Se$_{1-x}$ film to uncover the corresponding portion of the substrate while the portion of said film which was exposed to the H+ ion beam remains adhered to the substrate. Again solvents for the particular layers are known in the art as are the techniques required to apply the various layers.

FIG. 5 is a contrast curve for a negative resist of the invention. The results of FIG. 3 and FIG. 5 are summarized in Table I. Pattern delineation in the submicron range ($\approx$0.1 um) has been achieved with confermal gold mask technique employing g-Ge$_{0.25}$Se$_{0.75}$ as a negative ion resist Alternately, if focussed ion beams are used to write directly the patterns than one can easily produce 200 Å line width patterns because the estimated diffusion length of the excited carriers in g-Ge$_x$Se$_{1-x}$ is of the order of 100 Å

TABLE I

Ion Beam (H+) Exposed Lithographic Parameters of g-Ge$_{0.25}$Se$_{0.75}$ Films:

| Resist | Sensitivity | Contrast |
|---|---|---|
| Positive: | | |
| GeSe (at 60 keV ions) | $1.4 \times 10^{-4}$ c/cm$^2$ | ~0.4 |
| Negative: | | |
| 0° - Film Ag$_2$Se/GeSe (at 60 keV) | $1.4 \times 10^{-5}$ | 5.3 |
| 80° - Film: Ag$_2$Se/GeSe (at 60 keV) | $1.4 \times 10^{-6}$ c/cm$^2$ | 3.0 |
| (at 150 keV) | $2.3 \times 10^{-6}$ | 4.2 |
| PMMA (H+ ions at 30 keV) | ~$10^{-6}$ | |

What is claimed is:

1. A method of forming a predetermined pattern on a substrate which comprises
   (a) forming a thin (g-Ge$_x$Se$_{1-x}$) film on a solid substrate by vacuum vapor deposition wherein the angle of deposition is an angle between 5° to about 85° with respect to the normal,
   (b) masking a portion of said film with an ion beam penetration retarding masking material,
   (c) exposing the unmasked portion of the film to an ion beam at a voltage adapted to and with an ion dose sufficient to provide a substantial differential dissolution rate between the masked and unmasked portion of the film when developed with a solvent for said film, and
   (d) developing said film by removing the exposed portion of that film to uncover the corresponding portion of the substrate while the portion of said film which was masked during the exposure remains adhered to the substrate.

2. A method of forming a predetermined film pattern upon a substrate as in claim 1, which comprises depositing said GeSe film on the substrate, depositing a coating of nickel over said film, depositing a photoresist over said nickel film, exposing a predetermined pattern on said photoresist and developing said photoresist to form a predetermined exposed nickel surface, plating gold on the exposed nickel surface and subsequently lifting off of the remaining photoresist pattern, exposing a resultant structure to ion beam irradiation, etching the exposed structure to remove the portion of the nickel layer which forms a surface of the structure, developing the structure to remove the hydrogen ion beam exposed portions of the GeSe film and etching the resultant structure to remove the remaining gold and nickel layer to provide a structure comprises a substrate having adhered thereon a predetermined pattern of a GeSe film.

3. A method as in claim 1 or 2 where the substrate comprises glass, silicone or $SiO_2$.

4. A method as in claim 1 or 2 where the mask is a conformal gold mask.

5. A method of forming a predetermined film pattern upon a substrate which comprises:
  (a) forming an adherent thin ($g\text{-}Ge_xSe_{1-x}$) film on a solid substrate by vacuum vapor deposition wherein the angle of deposition is an angle between 5° to about 85° with respect to the normal,
  (b) forming an adherent surface layer of $Ag_2Se$, or other silver compounds or alloys on the surface of the ($g\text{-}Ge_xSe_{1-x}$) film,
  (c) masking a portion of the resultant article with an ion beam penetration retarding masking material,
  (d) exposing the unmasked portion of the $Ag_2Se$ layer to an ion beam at a voltage adapted to and with an ion dose sufficient to provide a substantial differential dissolution rate between the masked and unmasked portions of the ($g\text{-}Ge_xSe_{1-x}$) film, once the masked portion of the $Ag_2Se$ surface layer is removed,
  (e) removing the $Ag_2Se$ layer from the masked portion of the resultant ion beam exposed article,
  (f) developing said film by removing the unexposed portion of the film to uncover the corresponding portion of the substrate while the portion of said film which was unmasked during the exposure remains adhered to the substrate.

6. A method of forming a predetermined pattern on a substrate which comprises
  (a) forming a thin ($g\text{-}Ge_xSe_{1-x}$) film on a solid substrate by vacuum vapor deposition wherein the angle of deposition is an angle between 5° to about 85° with respect to the normal,
  (b) exposing a portion of the film to a focussed ion beam at a voltage adapted to and with an ion dose sufficient to provide a substantial differential dissolution rate between the exposed and unexposed portion of the film when developed with a solvent for said film, and
  (c) developing said film by removing the exposed portion of that film to uncover the corresponding portion of the substrate while the portion of said film which was masked during the exposure remains adhered to the substrate.

7. A method of forming a predetermined film pattern upon a substrate which comprises:
  (a) forming an adherent thin ($g\text{-}Ge_xSe_{1-x}$) film on a solid substrate by vacuum vapor deposition wherein the angle of deposition is an angle between 5° to about 85° with respect to the normal,
  (b) forming an adherent surface layer of $Ag_2Se$, or other silver compounds or alloys on the surface of the ($g\text{-}Ge_xSe_{1-x}$) film,
  (c) exposing a portion of the $Ag_2Se$ layer to a focussed $H^+$ ion beam at a voltage adapted to and with an ion dose sufficient to provide a substantial differential dissolution rate between the exposed and unexposed portions of the ($g\text{-}Ge_xSe_{1-x}$) film, once the unexposed portion of the $g\text{-}Ge_xSe_{1-x}$ surface layer is removed,
  (d) removing the $Ag_2Se$ layer from the unexposed portion of the resultant ion beam exposed article,
  (e) developing said film by removing the unexposed portion of the film to uncover the corresponding portion of the substrate while the portion of said film which was exposed during the ion exposure remains adhered to the substrate.

8. The methods of claim 1, 2, 5, 6 or 7 where the angle of deposition in (a) is between about 10° to about 80° with respect to the normal.

* * * * *

UNITED STATES PATENT OFFICE
CERTIFICATE OF CORRECTION

PATENT NO. : 4,405,710

DATED : September 20, 1983

INVENTOR(S) : KRANAM BALASUBRAMANYAM ET AL.

It is certified that error appears in the above-identified patent and that said Letters Patent are hereby corrected as shown below:

Column 1, after the title insert:

--The invention described herein was made in the performance of work under NASA Contract No. Grant NSG-7488 and is subject to the provisions of Section 305 of the National Aeronautics and Space Act of 1958 (72 Stat. 435; 42 U.S.C. 2457).--.

Column 7, line 14, change "comprises", to --comprising--.

Signed and Sealed this

Twenty-sixth Day of June 1984

[SEAL]

Attest:

GERALD J. MOSSINGHOFF

Attesting Officer

Commissioner of Patents and Trademarks